US011365472B2

(12) United States Patent
Rutten et al.

(10) Patent No.: US 11,365,472 B2
(45) Date of Patent: Jun. 21, 2022

(54) COATED CUTTING TOOL

(71) Applicant: SECO TOOLS AB, Fagersta (SE)

(72) Inventors: Gied Rutten, Lottum (NL); Lennart Karlsson, Venlo (NL)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 16/092,148

(22) PCT Filed: Apr. 7, 2017

(86) PCT No.: PCT/EP2017/058438
§ 371 (c)(1),
(2) Date: Oct. 8, 2018

(87) PCT Pub. No.: WO2017/174801
PCT Pub. Date: Oct. 12, 2017

(65) Prior Publication Data
US 2019/0161849 A1    May 30, 2019

(30) Foreign Application Priority Data
Apr. 8, 2016 (EP) .................. 16164553

(51) Int. Cl.
*C23C 14/14* (2006.01)
*C23C 14/06* (2006.01)
(Continued)

(52) U.S. Cl.
CPC .......... *C23C 14/0641* (2013.01); *B23B 27/14* (2013.01); *C04B 41/5062* (2013.01);
(Continued)

(58) Field of Classification Search
CPC ............ B23B 2224/08; B23B 2224/24; B23B 2224/36; C23C 28/04–044;
(Continued)

(56) References Cited

U.S. PATENT DOCUMENTS 5,580,653 A * 12/1996 Tanaka .................. C23C 30/005
51/307
6,274,249 B1 * 8/2001 Braendle ................ C23C 14/54
428/553

(Continued)

FOREIGN PATENT DOCUMENTS

EP      2835445 A1 *  2/2015 ........... C23C 30/005
JP      2007021650 A    2/2007
(Continued)

OTHER PUBLICATIONS

Machine translation of JP 2012/035379A, obtained from J-PlatPat service of the JPO (Year: 2021).*

(Continued)

*Primary Examiner* — Z. Jim Yang
(74) *Attorney, Agent, or Firm* — Corinne R. Gorski

(57) ABSTRACT

A coated cutting tool includes a body and a PVD coating disposed on the body. The body being cemented carbide, cermet, ceramics, polycrystalline diamond, polycrystalline cubic boron nitride based materials or a high speed steel. The coating includes a first layer of $(Ti_{1-x}Al_x)N$ wherein $0.3 \leq x \leq 0.7$, and a second layer of $(Ti_{1-p-q}Al_p Si_q)N$ with $0.15 \leq p \leq 0.45$, and $0.05 \leq q \leq 0.20$, wherein the second layer is deposited outside the first layer as seen in a direction from the body.

11 Claims, 7 Drawing Sheets

(51) Int. Cl.

| | |
|---|---|
| *C23C 14/02* | (2006.01) |
| *C23C 14/32* | (2006.01) |
| *C23C 28/04* | (2006.01) |
| *C23C 28/00* | (2006.01) |
| *C04B 41/50* | (2006.01) |
| *B23B 27/14* | (2006.01) |

(52) U.S. Cl.
CPC ...... *C04B 41/5063* (2013.01); *C04B 41/5068* (2013.01); *C23C 14/021* (2013.01); *C23C 14/0652* (2013.01); *C23C 14/325* (2013.01); *C23C 28/042* (2013.01); *C23C 28/044* (2013.01); *C23C 28/42* (2013.01); *B23B 2222/28* (2013.01); *B23B 2224/24* (2013.01); *B23B 2228/08* (2013.01); *B23B 2228/105* (2013.01)

(58) Field of Classification Search
CPC .......... C23C 28/40–44; C23C 14/0641; C23C 14/0652; C23C 16/34; C23C 16/345; C04B 41/5063; C04B 41/5068
See application file for complete search history.

(56) References Cited

U.S. PATENT DOCUMENTS

| | | | | |
|---|---|---|---|---|
| 2002/0039670 A1* | 4/2002 | Ishikawa | ............. | C23C 14/0641 428/697 |
| 2006/0154108 A1* | 7/2006 | Fukui | .................... | C23C 30/005 428/698 |
| 2006/0183000 A1* | 8/2006 | Kondo | .................. | C23C 30/005 428/698 |
| 2006/0269788 A1* | 11/2006 | Ishikawa | ............... | C23C 14/325 428/701 |
| 2007/0184272 A1* | 8/2007 | Moriguchi | ............ | C23C 30/005 428/411.1 |
| 2007/0275268 A1* | 11/2007 | Takaoka | .............. | C23C 14/0641 428/698 |
| 2007/0284255 A1* | 12/2007 | Gorokhovsky | ......... | C22C 19/03 106/286.4 |
| 2008/0166583 A1* | 7/2008 | Astrand | ................ | C23C 30/005 428/602 |
| 2009/0130434 A1* | 5/2009 | Zhu | .................... | C04B 35/58014 407/119 |
| 2010/0061812 A1* | 3/2010 | Ljungberg | ............. | C23C 28/044 407/30 |
| 2011/0033723 A1* | 2/2011 | Kim | .................... | C23C 14/0021 428/553 |
| 2011/0135898 A1* | 6/2011 | Bohlmark | ............... | C23C 30/00 427/255.18 |
| 2012/0114436 A1* | 5/2012 | Andersson | ............ | C04B 41/009 407/119 |
| 2012/0114437 A1* | 5/2012 | Andersson | ............ | C23C 30/005 407/119 |
| 2012/0237792 A1* | 9/2012 | Inspektor | ............. | C23C 14/0641 427/255.15 |
| 2013/0065081 A1* | 3/2013 | Ni | ......................... | C23C 28/044 428/660 |
| 2013/0171374 A1* | 7/2013 | Sjolen | ................... | C23C 30/005 427/580 |
| 2015/0125677 A1* | 5/2015 | Park | .................... | C23C 14/0641 428/220 |
| 2015/0152561 A1* | 6/2015 | Kang | ................... | C23C 28/027 428/698 |
| 2015/0292078 A1* | 10/2015 | Tanaka | .................... | C23C 14/24 428/328 |
| 2015/0337459 A1* | 11/2015 | Ahn | .................... | C23C 14/0641 428/212 |
| 2016/0175939 A1* | 6/2016 | Tanaka | .................. | C23C 28/044 428/216 |
| 2016/0193662 A1* | 7/2016 | Park | ...................... | C23C 28/042 428/216 |
| 2017/0216930 A1* | 8/2017 | Sato | ......................... | C30B 23/08 |
| 2017/0266733 A1* | 9/2017 | Sato | ......................... | B23B 27/20 |
| 2018/0099335 A1* | 4/2018 | Takeshita | ................ | B23B 27/14 |
| 2018/0193924 A1* | 7/2018 | Tanaka | ................ | C23C 14/0658 |
| 2018/0223415 A1* | 8/2018 | Albers | ................. | C23C 28/044 |
| 2018/0245201 A1* | 8/2018 | Park | ....................... | C23C 14/548 |
| 2018/0281078 A1* | 10/2018 | Hirano | .................. | C23C 28/048 |
| 2019/0111495 A1* | 4/2019 | Maekawa | ............... | C04B 41/52 |
| 2019/0111497 A1* | 4/2019 | Stiens | .................. | C23C 28/042 |

FOREIGN PATENT DOCUMENTS

| | | | |
|---|---|---|---|
| JP | 2009061520 A | * 3/2009 | |
| JP | 2011224715 A | * 11/2011 | |
| JP | 2012035379 A | * 2/2012 | |
| JP | 2015139868 A | * 8/2015 | ............ B23B 27/14 |
| JP | 2015178171 A | 10/2015 | |
| WO | WO-2017179233 A1 | * 10/2017 | ............ B23B 27/14 |

OTHER PUBLICATIONS

Lihui Zhu et al.: "High temperature oxidation behavior of TiAlN coating and TiAlSiN coating", Vacuum, Pergamon Press, GB, vol. 86, No. 12, Apr. 5, 2012, pp. 1795-1799.

* cited by examiner

COATED CUTTING TOOL

RELATED APPLICATION DATA

This application is a § 371 National Stage Application of PCT International Application No. PCT/EP2017/058438 filed Apr. 7, 2017 claiming priority to E{ 16164553.6 filed Apr. 8, 2016.

TECHNICAL FIELD

The present invention relates to a coated cutting tool for chip forming metal machining comprising a body and a coating for use in metal cutting applications generating high tool temperatures, e.g. super alloys, and/or abrasive materials, e.g., machining of hardened steels. The coating comprising of at least two sub-coatings based on (Ti,Al)N and (Ti,Al,Si)N deposited by means of physical vapour deposition (PVD).

BACKGROUND OF THE INVENTION

Since the mid 1980's, efforts have been made to improve the properties e.g. wear resistance and hence the performance of PVD tool coatings. At that time, the common practice was to coat cutting tools with TiN and later with Ti(C,N) and combinations thereof. However, due to its relatively poor oxidation resistance at elevated temperatures, alloying TiN with Al resulting in (Ti,Al)N was suggested and implemented with good results in the mid-1990's and sometimes in multilayer with Ti(C,N) to combine the properties.

Today (Ti,Al)N based coatings are among the most common hard and protective PVD coating materials used in metal cutting applications. The cubic, B1, structure of (Ti, Al)N, as a monolith layer or part of a laminated coating structure, combine attractive mechanical properties such as high hardness and improved high temperature stability and oxidation resistance providing good performance in metal machining applications. The technological benefits of (Ti, Al)N and its excellent physical properties, especially at elevated temperatures, is partly explained in terms of a spinodal decomposition process during which cubic (Ti, Al)N decompose isostructurally into coherent cubic c-AlN- and c-TiN-enriched domains. The combination of elastic properties and a lattice mismatch between coherent c-AlN- and c-TiN-enriched domains leads to significant age hardening during which the hardness of (Ti,Al)N thin layers have shown to increase with between 15% and 20%. At further aging, c-AlN transforms into the thermodynamically stable hexagonal, wurtzite B4 structure, h-AlN resulting in a dual phase structure comprising c-TiN and h-AlN with reduced mechanical properties.

During the 2000's alloying with Si into the TiN generating a (Ti,Si)N materials started to be used to improve the hardness and thermal properties which is especially useful for machining of hardened materials. Often have the (Ti, Si)N layers been one of the layers in a laminated structure combined with (Ti,Al)N based layers.

Today industry continuously seeks solutions for economic and high productivity manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity cutting process results in a dramatic increase of the tool temperature and hence a coating material with a high temperature wear resistance is essential.

High efficient machining of full hardened materials (48 up to 65 HRC) become more and more important for the Die&Mold industry producing dies and molds for e.g pressing, injection, extrusion etc. since it reduces the overall production cost as well as the lead time due to eliminating the hardening treatment and the grinding/polishing operations.

OBJECT OF THE INVENTION

It is an object of the present invention to provide a coated cutting tool especially suited for machining of hardened steels with a coating showing improved high temperature properties as well as high abrasive wear resistance, that results in improved performance in metal cutting applications generating high temperatures and/or demands high abrasive wear resistance. The invention also demonstrate high capability to remain the macro cutting geometry stable in order to generate a constant surface profile during long time of use, which is especially important for machining of e.g. molds and dies from hardened steels.

SUMMARY OF THE INVENTION

According to a first aspect of the present invention there is provided a hard and wear resistant PVD coating on a body, wherein the body comprises cemented carbide, cermet, ceramics, polycrystalline diamond, polycrystalline cubic boron nitride based materials, or high speed steels, and the coating comprises a first layer of $(Ti_{1-x}Al_x)N$ with $0.3 \leq x \leq 0.7$ and a second layer of $(Ti_{1-p-q}Al_p Si_q)N$ with $0.15 \leq p \leq 0.45$ and $0.05 \leq q \leq 0.20$, wherein the second layer is deposited outside the first layer as seen in a direction from the body.

A body as described in the present description and claims should be understood as a substrate onto which the hard and wear resistant PVD coating is deposited. Common for cutting tools is that this body, e.g., a solid carbide milling tool, drill or a cutting insert, may be a solid body or a body comprising a backing body onto which an additional material is placed.

According to one embodiment of the invention $0.40 \leq x \leq 0.70$, preferably $0.50 \leq x \leq 0.70$, most preferably $0.60 \leq x \leq 0.67$.

According to one embodiment $0.20 \leq p \leq 0.40$, preferably $0.25 \leq p \leq 0.37$.

According to one embodiment $0.08 \leq q \leq 0.18$, most preferably $0.10 \leq q \leq 0.18$.

According to one embodiment of the invention the second layer is a single layer.

According to one embodiment the first layer has a thickness from 0.2 µm to 5.0 µm, preferably from 0.2 µm to 3.0 µm, most preferably from 0.2 µm to 2.5 µm.

According to one embodiment the second layer has a thickness from 0.5 µm to 6.0 µm, preferably from 0.5 µm to 4.0 µm, most preferably from 1.0 µm to 3.0 µm.

According to one embodiment the first layer is arranged in contact with the body.

According to one embodiment the second layer is arranged on and in contact with the first layer.

According to one embodiment the first layer comprises a first sub-layer and a second sub-layer, the first sub-layer being arranged closer to the body than the second sub-layer and is having an average column width that is at least twice the grain size of the second sub-layer, preferably four times the grain size of the second sub-layer.

According to one embodiment the first sub-layer of the first layer has a thickness that is from 0.2 to 1 µm, and the second sub-layer has a thickness from 0.2 to 2.0 µm.

According to one embodiment the first sub-layer of the first layer has an average column width from 50 to 200 nm.

According to one embodiment the second sub-layer of the first layer has an average grain-size that is from 5 to 30 nm.

According to one embodiment the coating comprises an outer layer being a single or laminated layer deposited onto and in contact with the second layer, and comprising any of the following compositions: TiN, (Ti,Al)N, (Ti,Al,Si)N. The outer layer could also be a carbonitride or any other nitride from the previous mentioned nitrides. Preferably the outer layer is a single layer of (Ti,Al,Si)N.

According to one embodiment, the coating comprises an outermost layer consisting of $(Ti_{1-p-q}Al_pSi_q)N$, where $0.15 \leq p \leq 0.45$ and $0.05 \leq q \leq 0.20$.

According to one embodiment, the coating comprises an outermost layer consisting of $(Ti_{1-p-q}Al_pSi_q)N$, where $0.15 \leq p \leq 0.45$ and $0.05 \leq q \leq 0.20$, and the outermost layer has a lower Al- and/or Si-content than the second layer.

According to one embodiment the outermost layer is deposited onto and in contact with the second layer, and has a thickness from 0.05 µm to 0.8 µm, preferably from 0.1 µm to 0.5 µm.

According to one embodiment the total coating thickness, $t_{OD}$, measured on the outer diameter of the tool, including any optional innermost or outermost layer, is from 0.7 µm to 10 µm, preferably from 1.0 µm to 8 µm, and most preferably from 1.0 µm to 5 µm.

According to one embodiment the body consists of cemented carbide comprising 4-15 wt % Co and a balance of WC, preferably 4-15 wt % Co, 0-2 wt % Cr and a balance of WC.

According to one embodiment the body consists of cemented carbide comprising 8.5-9.5 wt % Co, 0-2 wt % Cr and a balance of WC, and a coercivity ($H_c$) higher than 35 kA/m.

According to one embodiment of the invention the solid milling tool comprises a cutting edge and a flank face, a corner radius or a full radius, the ratio of the coating thickness, $t_w$, measured on the flank face at a position at least 50 µm and at the most 100 µm from the cutting edge in a perpendicular direction from the cutting edge, and the coating thickness, $t_{OD}$, measured on the flank face at a distance of 50% of cutting diameter, Dc, and from a transition between the corner radius, or the full radius, and the outer diameter, is 0.7-1.2.

According to one embodiment the coated cutting tool is a full radius solid carbide milling tool, also called ball nose solid carbide milling tool, comprises a cutting edge, a rake face and a flank face, and the total coating thickness, $t_w$, as measured at a position at least 50 µm and at the most 100 µm from the cutting edge in a perpendicular direction on the flank face at a position 25% of the cutting diameter, Dc, out from the centre, is from 1.5 to 5 µm.

According to one embodiment the coated cutting tool is a high feed solid milling tool or a torical solid milling tool with a dish angle of more than 4°, preferably to be used for machining of hardened steel at low depth of cut and low width of cut, comprises a cutting edge, a rake face and a flank face, and the total coating thickness, $t_w$, as measured at a position at least 50 µm and at the most 100 µm from the cutting edge in a perpendicular direction on the flank face at a position 40% of the cutting diameter, Dc, out from the centre, is from 1.5 to 5 µm.

According to one embodiment the cutting tool is a solid carbide milling tool, preferably a full radius solid milling tool, also called a ball nose solid milling tool, a high feed solid milling tool or a torical solid milling tool with a dish angle of more than 4°.

One advantage with the coated cutting tool according to the present invention is that the hard and wear resistant coating has improved abrasive wear resistance and high temperature stability. Another advantage with the coated cutting tool according the present invention is that a coated cutting tool having improved performance in metal cutting applications in hard materials like hardened steel. A further advantage with the coated cutting tool according to the present invention is that it can be used for a long time generating high surface quality and keeping required high tolerances on the produced workpiece.

According to a second aspect of the present invention there is provided a method for producing a coated cutting tool comprising a body and a hard and wear resistant coating by applying PVD (physical vapour deposition) techniques, preferably cathodic arc evaporation, the method comprising:
  cleaning of the body prior to deposition and
  growing of the first layer and the second layer by using composite or alloyed (Ti,Al) and (Ti,Al,Si) cathodes, respectively, applying an evaporation current between 50 A and 200 A, using a reactive gas atmosphere comprising pure N2 or mixed N2 and, e.g., Ar gases at a total gas pressure from 1.0 Pa to 8.0 Pa, applying a negative substrate bias from 20 V to 400 V, and applying a deposition temperature from 200° C. to 800° C., preferably from 300° C. to 600° C.

According to a third aspect of the present invention there is provided for use of a coated cutting tool according to any of the above described embodiments where the coated cutting tool is a solid carbide milling tool used for machining at cutting speeds of 50-300 m/min, preferably 80-280 m/min, with an average feed per tooth in the case of milling of 0.009-0.019×Dc mm, preferably 0.010-0.015×Dc mm, depending on workpiece material, hardness, cutting speed and solid end mill type. Dc is the diameter of the solid carbide milling tool.

DEFINITIONS

Figure 1:
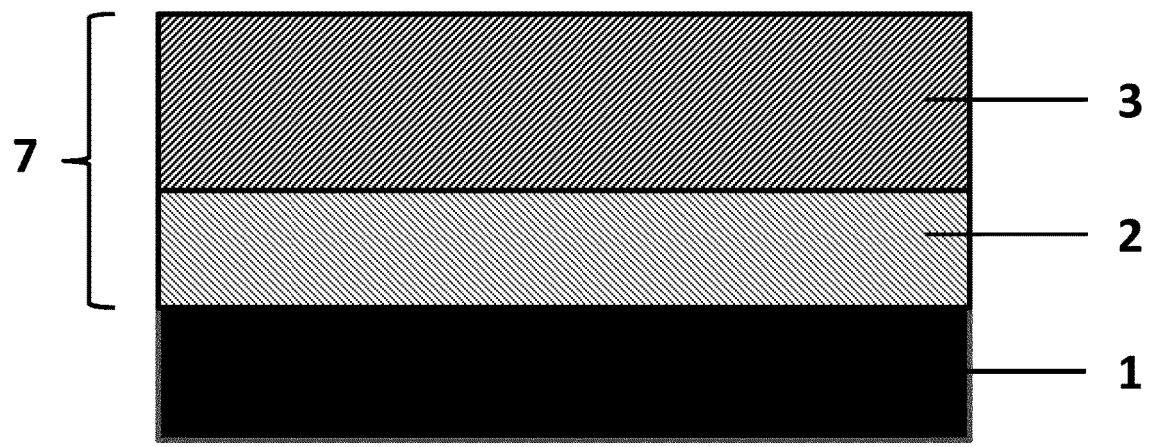
FIG. 1 shows a schematic coating architecture build-up according to one embodiment of the invention.

Single layer; the term is used for a layer deposited by allowing the body pass through the deposition fluxes solely from one combination of cathode compositions and growth parameters. Often this sort of single layers contains a layered structure if analysed at high enough magnification due to the by time alternating deposition conditions because of the rotation.

Laminated layer/coating; Generally, the laminated coatings structure, like variants A to C in example 1, are obtained by allowing the coating body to alternately pass through the deposition flux from at least two different cathode compositions used for growth of the different layers, at otherwise fixed deposition conditions. Since tools coated using a 3-fold rotation are not always passing in similar positions through the deposition flux in front of the evaporation sources of the different materials; no exact measures on wave length (the thickness of two subsequent layers of the different materials) or the individual layer thicknesses can be defined.

Composition; For the (Ti,Al)N layers and (Ti,Al,Si)N layers it should be understood that the nitrogen content is preferably close to stoichiometric but could be allowed to vary in the interval of 90-110 at %. Additionally, the layers may contain some oxygen (O) and/or carbon (C) in concentration from 0 to 3 at %, preferably from 0 to 2 at % as determined by EDS, in spite of that the chemical nomination just a N has been used throughout the description. If magnetron sputtering is used as deposition technique from 0 to 3 at % argon (Ar) may be present in the coating.

Grain size; The grain size and column width referred to in the description is based on analyse of the TEM micrographs for the coating 7 at a known magnification. Column width is used for the grain size when the grains are elongated in the growth direction of the layer and the layer thereby obtains a columnar grain-structure. The column width is the size of the grain perpendicular to its length direction.

For measuring the column width of the grains of the first sub-layer 4, the average column width intersecting a first line parallel to the surface of the body 1 of 10 grains was measured. The first line is drawn in the middle of the first sub-layer 4 parallel to the surface of the body 1 and the length of the first line intercepting 10 grains is measured. By calculating the true length of the first line intercepting 10 grains and dividing the true length of the first line with ten the average column width for one grain is obtained.

For measuring the grain size of the second sub-layer 5, the average size of 10 grains that are in reflection orientation (black) is measured. A second line is drawn in the middle of the second sub-layer 5 parallel to the surface of the body 1 and the combined length of the parts of the second line intercepting 10 grains that are in reflection orientation (black) is measured and calculated. By calculating the true length of the parts of the second line intercepting 10 grains and dividing the true length of the second line with ten the average grain size for one grain in the second sub-layer is obtained.

For measuring the column width of the second layer 3, the average width of 10 columns intersecting a line parallel to the surface of the body 1 was measured. A third line is drawn in the middle of the second layer 3 parallel to the surface of the body 1 and the length of the third line intercepting 10 grains is measured. By calculating the true length of the third line intercepting 10 grains and dividing the true length of the third line with ten the average column width for one grain in the second layer 3 is obtained.

DETAILED DESCRIPTION OF PREFERRED EMBODIMENTS

According to one embodiment of the invention, schematically shown in FIG. 1, there is provided a coated cutting tool comprising a body 1 of, for example, a cemented carbide, and a hard and wear resistant coating 7 deposited by PVD on the body. The coating 7 comprising a first layer 2 being a single layer of $(Ti_{1-x}Al_x)N$ where $0.3 \leq x \leq 0.7$ and a second layer 3 of $(Ti_{1-p-q}Al_p Si_q)N$ where $0.15 \leq p \leq 0.45$ and $0.05 \leq q \leq 0.20$. The second layer 3 is deposited on and in contact with the first layer 2. The first layer has a thickness from 0.2 μm to 5.0 μm and the second layer has a thickness from 0.5 to 6.0 μm.

Figure 2:
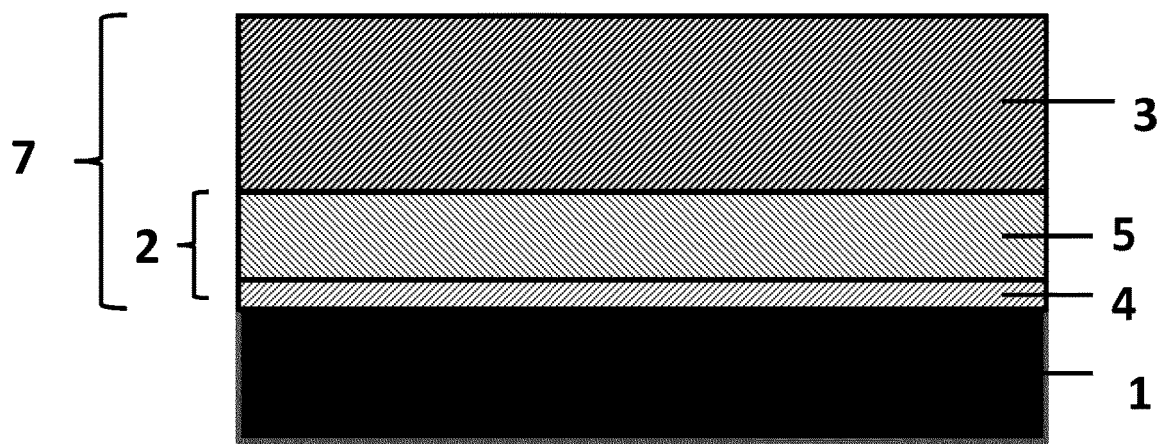
FIG. 2 shows a schematic coating architecture build-up according to one embodiment of the invention.

FIG. 2 shows an alternative embodiment of the invention where the body 1 of the coated cutting tool is provided with a coating 7 comprising a first layer 2 being a single layer of $(Ti_{1-x}Al_x)N$ where $0.3 \leq x \leq 0.7$, and a second layer 3 of $(Ti_{1-p-q}Al_p Si_q)N$ where $0.15 \leq p \leq 0.45$ and $0.05 \leq q \leq 0.20$. The second layer is deposited on and in contact with the first layer 2. The first layer comprises a first sub-layer 4 and a second sub-layer 5, the first sub-layer being arranged closer to the substrate than the second sub-layer 5. The first sub-layer 4 has a thickness that is from 0.2 μm to 1 μm, and the second sub-layer 5 has a thickness from 0.2 to 2.0 μm.

Figure 3:
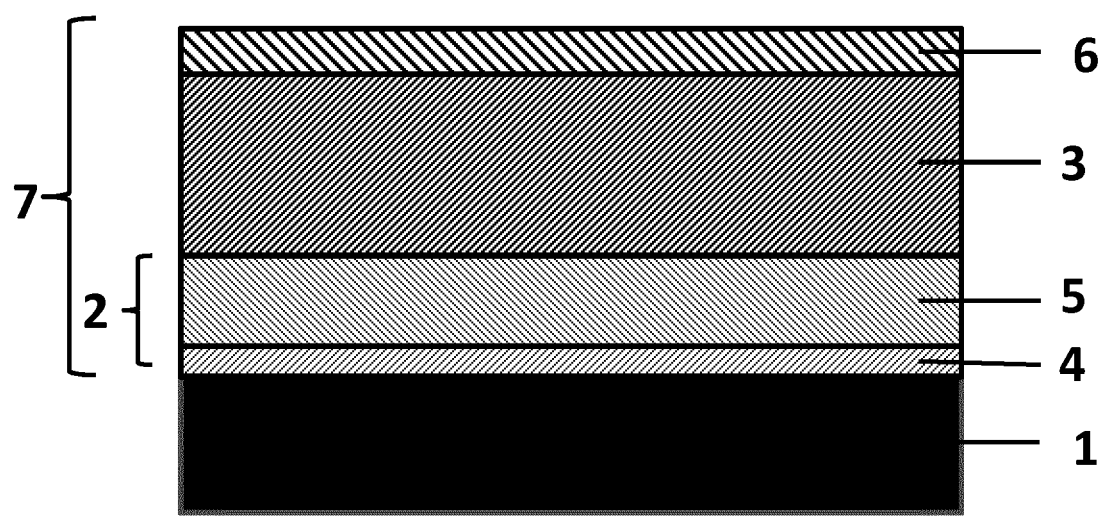
FIG. 3 shows a schematic coating architecture build-up according to one embodiment of the invention.

According to one embodiment of the present invention, schematically shown in FIG. 3, the coating described in connection with FIG. 2 is provided with an outermost layer 6 deposited on and in contact with the second layer 3. The outermost layer is a single layer of $(Ti_{1-p-q}Al_pSi_q)N$, where $0.15 \leq p \leq 0.45$ and $0.05 \leq q \leq 0.20$, and has a thickness from 0.1 μm to 0.5 μm. The outermost layer has a different stress state and/or surface morphology than second layer 3. Additionally, the outermost layer has a lower Al- and/or Si-content than the second layer.

Figure 4:
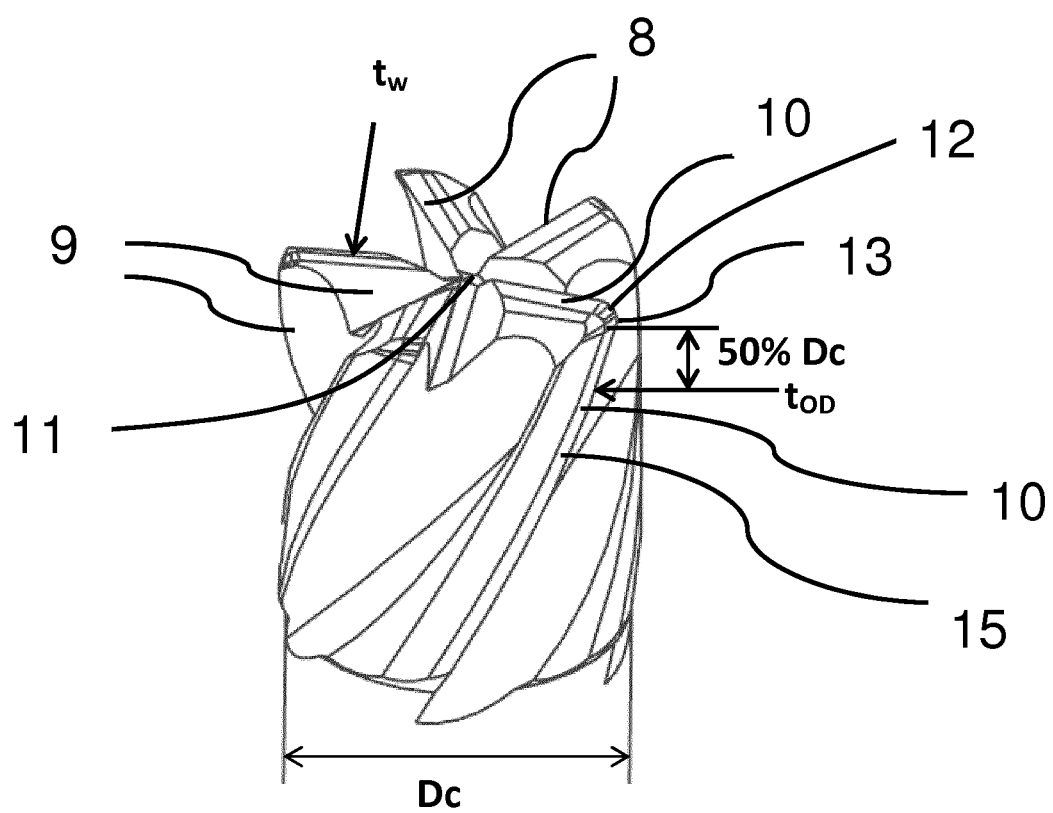
FIG. 4 shows a high feed solid milling tool or a torical solid milling tool with a dish angle of more than 4° and the positions for measuring the coating thickness.

FIG. 4 schematically shows a torical solid milling tool comprising a cutting edge 8, a rake face 9 and a flank face 10, an outer diameter 15, a corner radius 12, and a transition 14 between the corner radius 12, and the outer diameter 15. The coating or layer thickness, $t_w$, as measured at a position at least 50 μm and at the most 100 μm from the cutting edge in a perpendicular direction on the flank face, and at a position 40% of the tool diameter out from the centre 11, is from 1.5 to 5 μm.

Figure 5A:
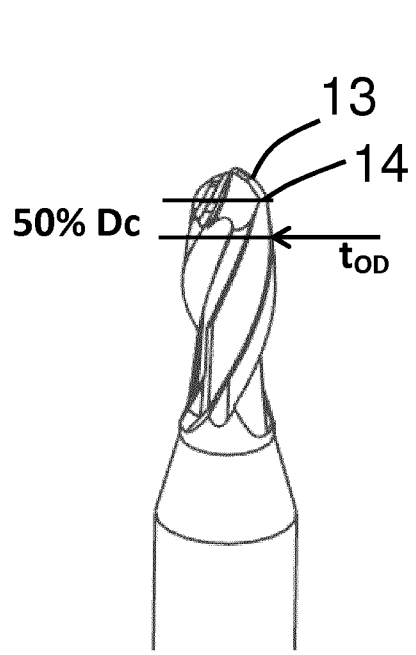
FIG. 5 a-c shows a full radius solid milling tool, also called a ball nose solid milling tool and the positions for measuring the coating thickness.
Figure 5B:
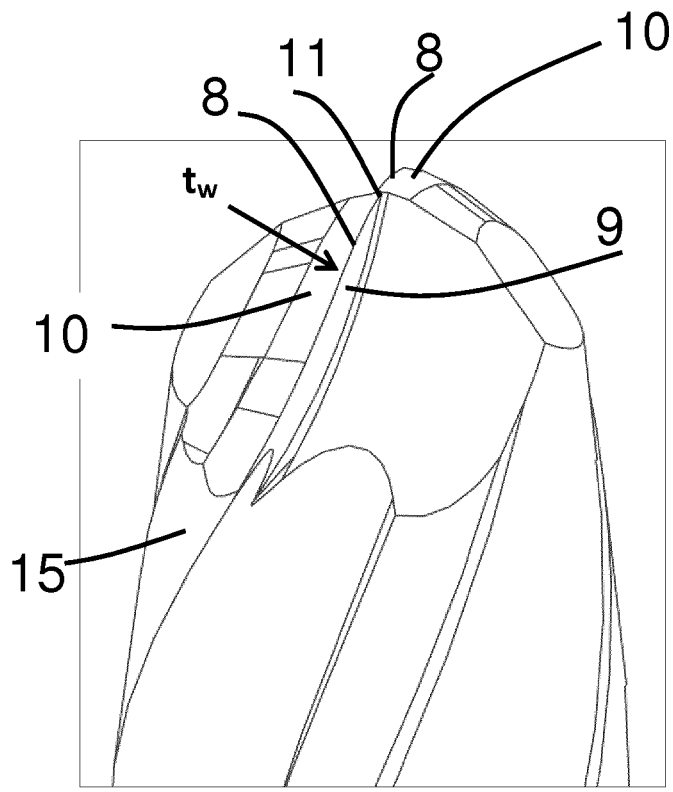
Figure 5C:
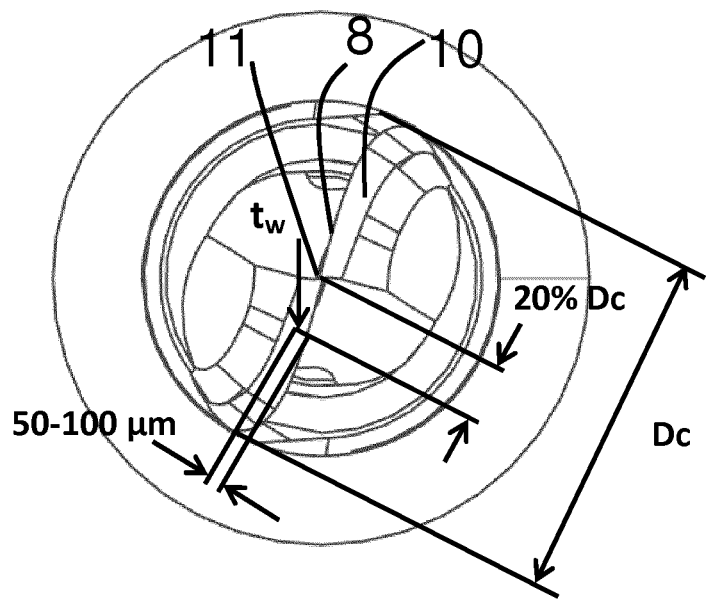

FIG. 5 a-c shows a full radius solid carbide milling tool, also called ball nose solid carbide milling tool, comprises a cutting edge 8, a rake face 9, a flank face 10, an outer diameter 15, a full radius 13, and a transition 14 between the full radius 13, and the outer diameter. The coating or layer thickness, $t_w$, as measured at a position at least 50 μm and at the most 100 μm from the cutting edge 8 in a perpendicular direction on the flank face, and at a position 25% of the tool diameter out from the centre 11, is from 1.5 to 5 μm.

Figure 6:
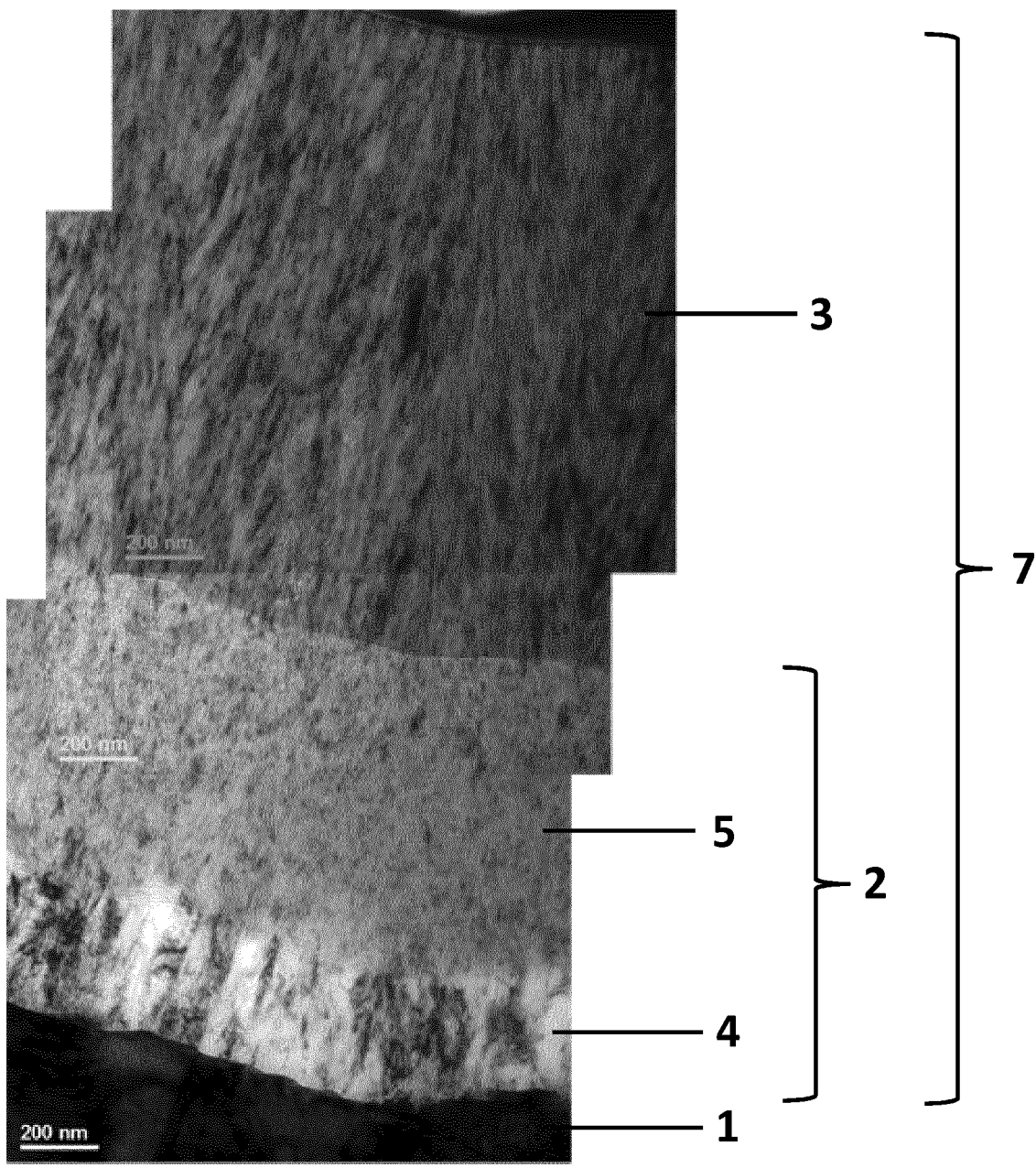
FIG. 6 shows a TEM (transition electron microscope) picture of the coating according to an embodiment of the invention.

FIG. 6 shows a TEM (transition electron microscope) picture of the coating according to an embodiment of the invention where the body 1 of the coated cutting tool is provided with a coating 7 comprising a first layer 2 being a single layer of $(Ti_{1-x}Al_x)N$ where $0.3 \leq x \leq 0.7$, and a second layer 3 of $(Ti_{1-p-q}Al_p Si_q)N$ where $0.15 \leq p \leq 0.45$ and $0.05 \leq q \leq 0.20$. The second layer is deposited on and in contact with the first layer 2. The first layer comprises a first sub-layer 4 and a second sub-layer 5, the first sub-layer being arranged closer to the substrate than the second sub-layer 5 and is having an average column width that is at least twice the grain size of the second sub-layer. The first sub-layer 4 has a thickness that is from 0.2 to 1 µm, and the second sub-layer 5 has a thickness from 0.2 to 2.0 µm.

Figure 8:
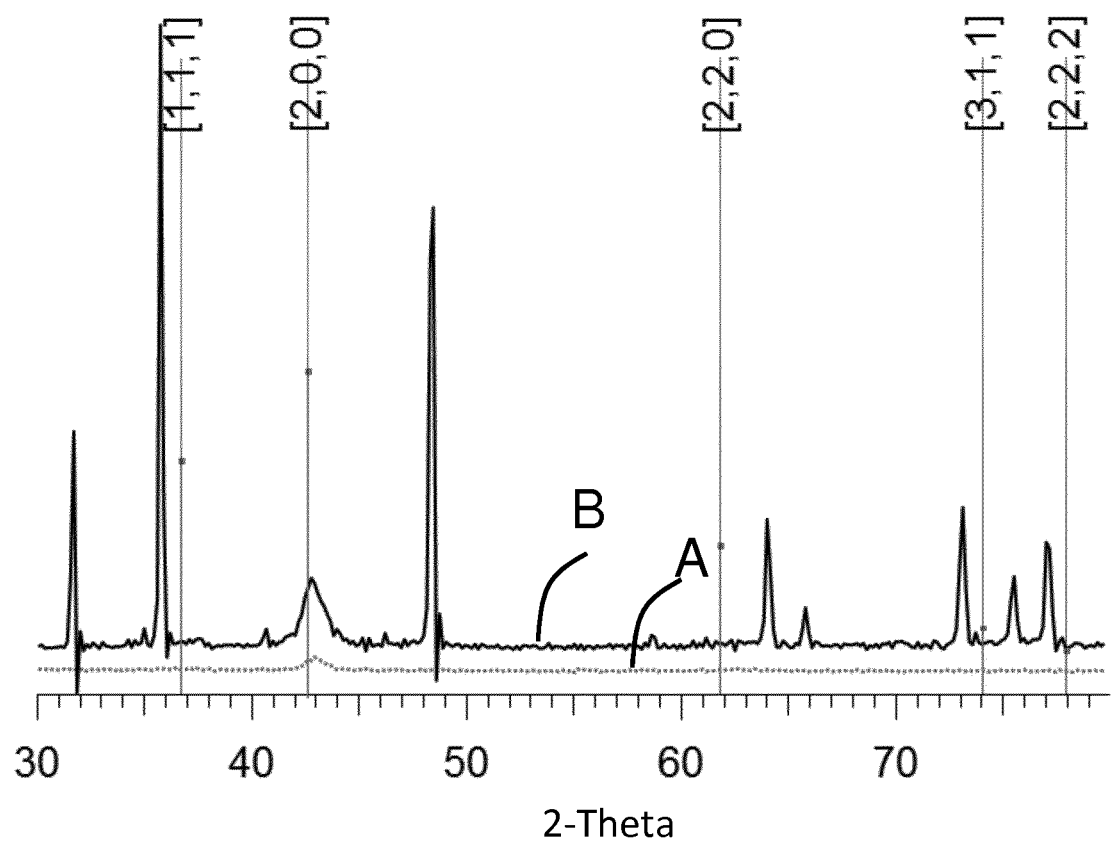
FIG. 8 shows an X-ray diffractogram according to an embodiment of the invention.

FIG. 8 shows an θ-2θ X-ray diffractogram of one embodiment of the present invention verifying the sodium chloride structure of the as-deposited coating comprising a first (Ti,Al)N-based sub-layer 4 a second (Ti,Al)N-based sub-layer 5 and a (Ti,Al,Si)N-based second layer 3. The broad diffraction peak at about 43° in 2Θ (x-axis) is the (200) lattice planes, of a sodium chloride structure. The rest of the peaks not indexed originate from the WC:Co body 1. The coating phase detection was performed by X-ray diffractometry (XRD) using a Bruker AXS D8-advance x-ray diffractometer and Cu Kα radiation in θ-2θ (Bragg-Brentano) configuration. Typically, the detection limit for each phase in a polycrystalline mixed phase materials is less than 5 vol %. Since no other peaks originating from the coating are present all layers consist of cubic sodium chloride phase with some different lattice parameters. The (Ti,Al)N-based first sub-layer 4, the (Ti,Al)N-based second sub-layer 5, and the (Ti,Al,Si)N-based second layer 3 consists of a cubic sodium chloride phase. Additionally, the coating 7 may also contain amorphous phases with small amounts, close to the detection limit of the XRD technique.

According to one embodiment of the invention, the body is a substrate for a coated cutting tool such as an end mill for machining by chip removal. The body comprises a body 1 of a hard alloy of cemented carbide, cermet, ceramics, polycrystalline diamond, cubic boron nitride (cBN) based material or high speed steel. The coating of this invention may also be used, for example, drills, threading taps, reamers, cutting inserts and other cuttings tools.

The (Ti,Al,Si)N coating may further comprise one or more further metal elements Me in small amounts not substantially altering the properties of the claimed (Ti,Al,Si)N coating, e.g., resulting from impurities in the targets used in the PVD deposition process, e.g., less than 1 at %, or less than 0.5 at %, or less than 0.3 at %, or less than 0.1 at %, of the sum of Ti+Al+Si+Me in the coating. Me is one or more of Zr, Hf, Cr, V, Nb, Ta, Mo, Fe, and W.

The second layer 3 may be a single layer comprising (Ti,Al,Me,Si)N where Me is one or several elements from group 4B, 5B and 6B of the periodic table, and Me is less than 5 at %.

According to one embodiment the second layer 3 is a laminated layer based on $(Ti_{1-p-q}Al_p Si_q)N$, where $0.15 \leq p \leq 0.40$, and $0.05 \leq q \leq 0.20$ and a second material TiN, (Ti,Al)N, (Ti,Al,Cr)N, (Cr,Al)N or other carbides and/or nitrides from group 4B, 5B and 6B of the periodic table.

EXAMPLES

Example 1

A solid cemented carbide ball nose cutter of diameter 6 mm and an edge rounding of more than 3 µm, with a compositions of 9 wt % Co and 0.4 wt % Cr and a balance of WC, cohesive force, Hc, 39 kA/m, were used as a body for the coatings deposited by cathodic arc evaporation.

Before deposition the tools were cleaned in ultrasonic baths of water based alkali solutions. The system was evacuated to a pressure of less than $2.0 \times 10^{-3}$ Pa, after which the tools mounted on a 3-fold rotating fixture were sputter cleaned using Ar ions.

A first layer being a (Ti,Al)N-based layer, consisting of a coarse grained $(Ti_{1-x}Al_x)N$ layer with x~0.65 deposited directly onto the cemented carbide body from composite cathodes of composition Ti/Al:33/67 at % in 3.5 Pa $N_2$ atmosphere using a bias between −40 and −100V. The growth temperature was of about 500° C. and the arc evaporation current used were in the range of 100-200 A. The thickness of the (Ti,Al)N-based first layer was from 0.50 to 1.3 µm.

Three different variants A, B and C of second layers, being abrasive wear resistant layers were deposited on the (Ti,Al)N-based first layers. The second layers consist of laminated structures consisting of alternating (Ti,Al)N and (Ti,Si)N layers, where the $(Ti_{1-x}Al_x)N$ layer has x~0.65, and the $(Ti_{1-y}Si_y)N$ layers has y~0.1 (variant A), y~0.15 (variant B) and y~0.2 (variant C). The deposition data for the laminated second layers were; 3.5 Pa $N_2$ atmosphere using a bias of −80V, growth temperature of about 500° C. and an arc evaporation current in the range of 130-180 A. The thickness of the laminated second layers, were from 0.9 to 1.3 µm.

The variant of the present innovation (variant D) had an abrasive wear resistant layer, corresponding to the second layer 3 in FIG. 1, with a composition of $(Ti_{1-a-b}Al_a Si_b)N_c$ with a~0.3, b~0.12 and c~1 (estimated from cathode composition). The growth of the second layer 3 was performed at 3.5 Pa $N_2$ atmosphere using a bias −80V, growth temperature of about 500° C. and an arc evaporation current in the range of 130-200 A used for the composite target of the composition Ti/Al/Si: 52/33/15 at %.

The copy milling test of a 3D shape was performed using the following cutting parameters;
  Application: Copy milling
  Work piece material: 1.2379 (62 HRc)
  Cutting speed: 170 m/min
  Fc: 0.11 mm
  Ae: 0.05 mm
  Ap: 0.05 mm
  Cooling MQL (minimal quantity lubrication)
  Performance criteria: Comparison of flank wear at a certain/different time in cut.

Figure 7:
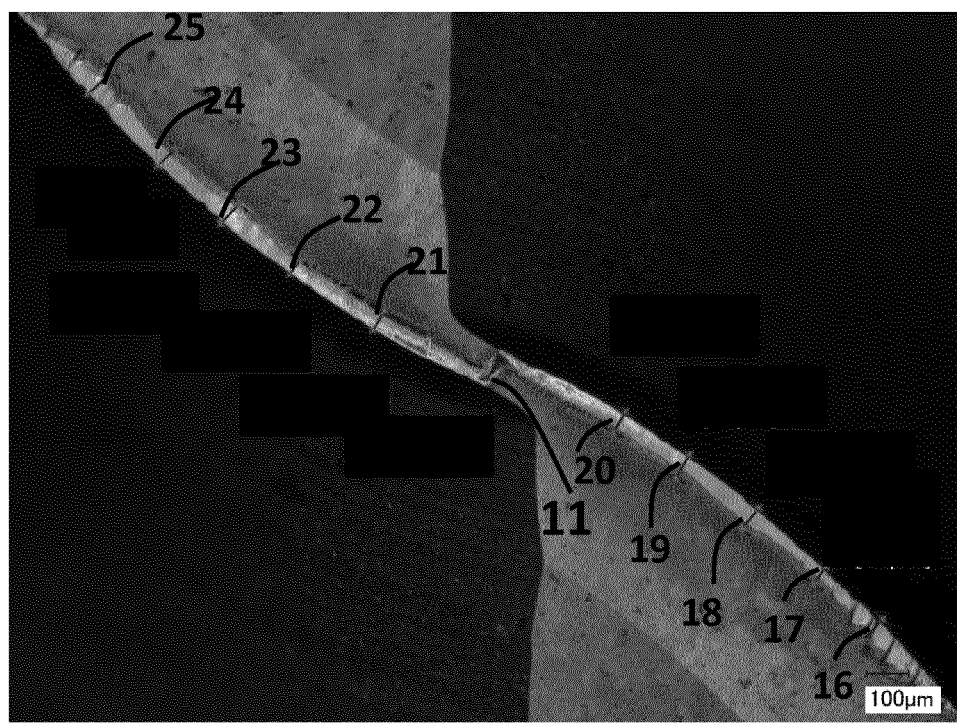
FIG. 7 shows an example on how to measure a wear scar, flank wear, of a ball nose solid milling tool.

The average flank wear were estimated as described and showed in FIG. 7 where the wear is characterized by the average of 10 measurements distributed over the wear. FIG. 7 shows a wear scare of a solid cemented carbide ball nose cutter. The position of the centre 11 of the picture in FIG. 7 corresponds to centre 11 in FIG. 5. In table 7 the size of the wear scare is according to the following in the different positions: position 16 is 74 µm; position 17 is 52 µm; position 18 is 65 µm; position 19 is 66 µm; position 20 is 58 µm; position 21 is 55 µm; position 22 is 42 µm; position 23 is 66 µm; position 24 is 62 µm; and position 25 is 83 µm. The results of the test are shown in table 1.

TABLE 1

| Variant | Description | Thickness First layer $t_{OD}$ (µm)* | Thickness Second Layer $t_{OD}$ (µm)* | Milling time (min) | Average flank wear (µm) |
|---|---|---|---|---|---|
| A Comparative | (Ti,Al)N + laminated (Ti,Al)/ $(Ti_{1-y}Si_y)N$; y~0.1, x~0.65 | 0.54 | 0.94 | 270 | 97 |

TABLE 1-continued

| Variant | Description | Thickness First layer $t_{OD}$ (μm)* | Thickness Second Layer $t_{OD}$ (μm)* | Milling time (min) | Average flank wear (μm) |
|---|---|---|---|---|---|
| B Comparative | (Ti,Al)N + laminated (Ti,Al)N/ (Ti$_{1-y}$,Si$_y$)N; y~0.15, x~0.65 | 1.3 | 2.7 | 360 | 71 |
| C Comparative | (Ti,Al)N + laminated (Ti,Al)N/ (Ti$_{1-y}$,Si$_y$)N; y~0.2, x~0.65 | 0.55 | 1.26 | 270 | 97 |
| D Invention | (Ti,Al)N + (Ti,Al,Si)N | 1.3 | 1.6 | 540 | 80 |

*$t_{OD}$, the layer thickness as measured on the position of $t_{OD}$ in FIG. 5.

Example 1 clearly shows that the tool life is much longer using a cutting tool according to an embodiment of the invention.

Example 2

In this example similar tools as in example 1 were coated. The first layer 2 was split into a first sub-layer 4 and second sub-layers 5 for variant F. The second sub-layer 5 consisted of a fine grained structure and the first sub-layer 4 consisted of a coarse grained structure like the ones seen for the sub-layers in FIG. 6. The second layer 3 was the same for both variant E and F and grown using the same data as for variant B in example 1. For variant F the second sub-layer 5 is about the double thickness of the first sub-layer 4. The column width of the first sub-layer 4 and the grain size of the second sub-layer 5 could be estimated to 100 nm and 15 nm, respectively. The results of the test are shown in table 2.

TABLE 2

| Variant | Description | Thickness First Layer $t_{OD}$ (μm)* | Thickness Second sub-layer $t_{OD}$ (μm)* | Thickness Second Layer $t_{OD}$ (μm)* | Milling time (min) | Average flank wear (um) |
|---|---|---|---|---|---|---|
| E Comparative | (Ti, Al)N + laminated (Ti, Al)N/(Ti, Si$_y$)N; y ~0.15 | 0.6 | — | 1.6 | 270 | 79 |
| F Invention | (Ti, Al)N + (Ti, Al, Si)N | 0.3 | 0.7 | 2.0 | 360 | 71 |

*$t_{OD}$, the layer thickness as measured on the position of $t_{OD}$ in FIG. 5.

Example 2 clearly shows that the tool life is increased when using g a cutting tool according to an embodiment of the invention, where the first layer 2 is partly fine grained.

Example 3

In this example similar tools as in example 1 were coated with different coating thicknesses. The coating thickness on the outer diameter of the tool, $t_{OD}$, was rather constant while the coating thickness at the end face $t_w$, were varied for variants G, H and I, see table 3. The deposition data for the first layer 2 of (Ti,Al)N was as in example 1 and for the second layer 3 of (Ti,Al,Si)N as in example 1 for variant D. The different coating thickness distributions were obtained by using different geometrical arrangements of the tool in the deposition flux.

A similar milling test as in example 1 was performed until a flank wear of 100 m were achieved. The results of the tests are shown in table 3.

TABLE 3

| Variant | Description | Total thickness first layer + second layer $t_{OD}$ (μm) | Total thickness first layer + second layer $t_w$ (μm) | Milling time (min) | Average flank wear (um) |
|---|---|---|---|---|---|
| G Invention | (Ti,Al)N + (Ti,Al,Si)N | 3.2 | 1.5 | 420 | 100 |

TABLE 3-continued

| Variant | Description | Total thickness first layer + second layer $t_{OD}$ (μm) | Total thickness first layer + second layer $t_w$ (μm) | Milling time (min) | Average flank wear (um) |
|---|---|---|---|---|---|
| H Invention | (Ti,Al)N + (Ti,Al,Si)N | 3.4 | 1.8 | 760 | 100 |
| I Invention | (Ti,Al)N + (Ti,Al,Si)N | 3.2 | 3.5 | 1080 | 100 |

* $t_{OD}$, the coating thickness as measured on the position of top in FIG. 5.

The ratio, k, between the coating thickness of the second layer 3 being a (TiAlSi)N-layer and the first layer 2 being a (Ti,Al)N-layer, (thickness the second layer 3)/(thickness first layer 2), was kept in the range of 0.7-0.9.

Example 3 shows that the tool life could be further increased by optimising the coating thickness distribution with increasing $t_w$ but does not depend on the $t_{OD}$ for this type of tool geometry in a cutting tool according to an embodiment of the invention.

Example 4

In this example similar tools as in example 1 were coated with different ratio, k (see definition in example 3), varying between 1.13 to 3.85. The results of the tests are shown in table 4.

TABLE 4

| Variant | Description | Thickness First Layer 2 $t_{OD}$ (μm)* | Thickness Second Layer 3 $t_{OD}$ (μm)* | k | Milling time (min) | Average flank wear (μm) |
|---|---|---|---|---|---|---|
| K Invention | (Ti, Al)N + laminate(Ti, Al)N/(Ti, Si$_y$)N; y ~0.2 | 0.54 | 0.95 | 1.76 | 270 | 97 |
| L Invention | (Ti, Al)N + laminate Ti, Al)N/(Ti, Si$_y$)N; y ~0.2 | 0.33 | 1.27 | 3.85 | 270 | 73 |

*$t_{OD}$, the layer thickness as measured on the position of $t_{OD}$ in FIG. 5.

Example 4 shows that the tool life could be further increased by optimising the layer thicknesses of the first and second layer towards increasing k value in a cutting tool according to an embodiment of the invention.

Example 5

In this example similar tools as in example 1 are coated. Variant M and N are coated as variant F in example 2. The variant O is a single layer fine grained (Ti$_{1-x}$Al$_x$)N$_z$ layer with x~0.65 and z~1 which is the coating used for this sort of work piece materials today. The results of the tests are shown in table 5.

The test was performed using following cutting data;
Workpiece material: 1.2344 (53 HRC)
Vc: 280 m/min
Fz: 0.078 mm
Ae: 0.05 mm
Ap: 0.05 mm
The variants were tested as in example 1 but the work piece material hardness was only HRC 53.

TABLE 5

| Variant | Description | Thickness First Layer[2] $t_{OD}$ (μm)* | Thickness Second Layer[3] $t_{OD}$ (μm)* | Total thickness $t_{OD}$ (μm)* | Milling time (min) | Average flank wear (μm) |
|---|---|---|---|---|---|---|
| M Invention | coarse + fine grained (Ti, Al)N + (Ti, Al, Si)N | 1.3 | 2.1 | 3.4 | 800 | 40 |
| N Invention | coarse + fine grained (Ti, Al)N + (Ti, Al, Si)N | 1.3 | 1.6 | 2.9 | 800 | 48 |
| O Comparative | (Ti, Al)N fine grained | 2.3 | — | 2.3 | 800 | 65 |

*$t_{OD}$, the layer thickness as measured on the position of $t_{OD}$ in FIG. 5.

This example clearly shows that the tool life is increased when copy milling in softer materials and using a cutting tool according to an embodiment of the invention.

Example 6

In this example solid carbide high feed milling tools with a diameter of 6 mm, a compositions of 9 wt % Co, 0.4 wt % Cr and a balance of WC, cohesive force, Hc, 39 kA/m, are coated. Variant P is coated as variant F in example 2. The variant Q is a single layer fine grained $(Ti_{1-x}Al_x)N_z$ layer with x~0.65 and z~1 which is the coating used for this sort of work piece materials today. The results of the tests are shown in table 6.

The test was performed using following cutting data:
Coolant: Emulsion
Workpiece Material: Ti6Al4V
Cutting Data:
Vc=115 m/min
n=6100 RPM
Vf=2440 mm/min
fz=0.1 mm
ap=0.15 mm
ae=4 mm

TABLE 6

| Variant | Description | Thickness First Layer[2] $t_{OD}$ (μm)* | Thickness Second Layer[3] $t_{OD}$ (μm)* | Total thickness $t_{OD}$ (μm)* | Milling distance (m) | Average flank wear (μm) |
|---|---|---|---|---|---|---|
| P Invention | coarse + fine grained (Ti, Al)N + (Ti, Al, Si)N | 1.3 | 1.6 | 2.9 | 114 | 107 |
| Q Comparative | (Ti, Al)N fine grained | 2.3 | — | 2.3 | 114 | 137 |

*$t_{OD}$, the layer thickness as measured on the position of $t_{OD}$ in FIG. 5.

This example clearly shows that the tool life is increased in pocket milling of titanium alloys when using a cutting tool according to an embodiment of the invention.

The invention claimed is:

1. A coated cutting tool comprising:
a body; and
a PVD coating disposed on the body, wherein the body comprises cemented carbide, cermet, ceramics, polycrystalline diamond, polycrystalline cubic boron nitride based materials or a high speed steel, the coating including a first layer and a second layer, the first layer having a composition of $(Ti_{1-x}Al_x)N$ with $0.3 \leq x \leq 0.7$ and a thickness from 0.4 μm to 5.0 μm, and the second layer being a single layer having a composition of $(Ti_{1-p-q}Al_p Si_q)N$ with $0.15 \leq p \leq 0.45$ and $0.08 \leq q \leq 0.20$, wherein the second layer has a thickness from 0.5 μm to 3.0 μm and is arranged directly above the first layer as seen in a direction from the body, wherein the first layer includes a first sub-layer and a second sub-layer, the second sub-layer having a grain size, the first sub-layer having a columnar grain structure and being arranged closer to the body than the second sub-layer and having an average column width that is at least twice the grain size of the second sub-layer.

2. The coated cutting tool according to claim 1, wherein $0.60 \leq x \leq 0.67$.

3. The coated cutting tool according to claim 1, wherein $0.20 \leq p \leq 0.40$.

4. The coated cutting tool according to claim 1, wherein $0.08 \leq q \leq 0.18$.

5. The coated cutting tool according to claim 1, wherein the second layer has a thickness from 1.0 μm to 3.0 μm.

6. The coated cutting tool according to claim 1, wherein the first sub-layer has a thickness that is from 0.2 μm to 1 μm, and the second sub-layer has a thickness from 0.2 μm to 2.0 μm.

7. The coated cutting tool according to claim 1, wherein the first sub-layer has an average column width that is from 50 nm to 200 nm and the second sub-layer has an average grain-size that is from 5 nm to 30 nm.

8. The coated cutting tool according to claim 1, wherein said body is cemented carbide comprising 4-15 wt % Co, 0-2 wt % Cr and a balance of WC.

9. The coated cutting tool according to claim 1, wherein the solid milling tool includes a cutting edge, a flank face, an outer diameter, a corner radius or a full radius, and an outer diameter, a ratio of the coating thickness, $t_w$, measured on the flank face at a position at least 50 μm and at the most 100 μm from the cutting edge in a perpendicular direction from the cutting edge, and the coating thickness, $t_{OD}$, measured on the flank face at a distance of 50% from a cutting diameter, Dc, and from a transition between the corner radius or the full radius, and the outer diameter, being from 0.7 to 1.2.

10. A coated cutting comprising:
a body; and
a PVD coating disposed on the body, wherein the body comprises cemented carbide, cermet, ceramics, polycrystalline diamond, polycrystalline cubic boron nitride based materials or a high speed steel, the coating including a first layer and a second layer, the first layer having a composition of $(Ti_{1-x}Al_x)N$ with $0.3 \leq x \leq 0.7$ and a thickness from 0.4 μm to 5.0 μm, and the second layer being a single layer having a composition of $(Ti_{1-p-q}Al_p Si_q)N$ with $0.15 \leq p \leq 0.45$ and $0.08 \leq q \leq 0.20$, wherein the second layer has a thickness from 0.5 μm to 3.0 μm and is arranged directly above the first layer as seen in a direction from the body, wherein the coating includes an outermost layer of $(Ti_{1-p-q}Al_p Si_q)N$, where $0.15 \leq p \leq 0.45$ and $0.05 \leq q \leq 0.20$, and having a thickness that is from 0.05 μm to 0.8 μm, and where the outermost layer has a stress state that differs from the second layer.

11. A method for manufacturing a coated cutting tool according to claim 1 by applying physical vapor deposition (PVD) techniques, the method comprising:
cleaning the body prior to deposition; and
growing of the first layer and the second layer by using composite or alloyed (Ti,Al) and (Ti,Al,Si) cathodes, respectively, applying an evaporation current between 50 A and 200 A, using a reactive gas atmosphere comprising pure N2 or mixed N2 and, Ar gases at a total gas pressure from 1.0 Pa to 8.0 Pa, applying a negative substrate bias from 20 V to 300 V, and applying a deposition temperature from 200° C. to 800° C.

* * * * *